United States Patent
Murayama et al.

(10) Patent No.: US 9,591,742 B2
(45) Date of Patent: Mar. 7, 2017

(54) INTERPOSER AND SEMICONDUCTOR DEVICE INCLUDING THE SAME

(71) Applicant: SHINKO ELECTRIC INDUSTRIES CO., LTD., Nagano-shi, Nagano (JP)

(72) Inventors: Kei Murayama, Nagano (JP); Mitsutoshi Higashi, Nagano (JP); Koji Nagai, Nagano (JP); Hideaki Sakaguchi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 270 days.

(21) Appl. No.: 14/291,243

(22) Filed: May 30, 2014

(65) Prior Publication Data

US 2014/0362552 A1    Dec. 11, 2014

(30) Foreign Application Priority Data

Jun. 5, 2013  (JP) ................................. 2013-119125

(51) Int. Cl.
*H05K 7/00* (2006.01)
*H05K 1/02* (2006.01)

(52) U.S. Cl.
CPC ......... *H05K 1/0203* (2013.01); *H05K 1/0272* (2013.01); *H01L 2224/16225* (2013.01);
(Continued)

(58) Field of Classification Search
CPC ... H01L 23/36; H01L 23/427; H01L 23/4093; H01L 23/473
(Continued)

(56) References Cited

U.S. PATENT DOCUMENTS 7,298,623 B1 * 11/2007 Kuczynski ............ H01L 23/473
174/15.1
2009/0040715 A1   2/2009 Sunohara et al.
(Continued)

FOREIGN PATENT DOCUMENTS

EP          1936685 A2 *  6/2008  ........... H01L 21/563
JP          2008-159619       7/2008
(Continued)

OTHER PUBLICATIONS

Japanese Office Action with English Machine Translation dated Dec. 8, 2016, 7 pages.

*Primary Examiner* — Tuan T Dinh
(74) *Attorney, Agent, or Firm* — Rankin, Hill & Clark LLP

(57) ABSTRACT

There is provided an interposer for cooling an electronic component. The interposer includes: a substrate body having a hollow cooling channel therein, wherein a cooling medium flows through the cooling channel, the cooling channel including: a plurality of main cooling channels extending in a certain direction and separated from each other; an inflow channel which is communicated with one end of the respective main cooling channels; and an outflow channel which is communicated with the other end of the respective main cooling channels, and a plurality of through electrode groups each comprising a plurality of through electrodes arranged in a line. Each of the though electrodes is formed through the substrate body to reach the first and second surfaces of the substrate body. The respective through electrode groups are partitioned by at least corresponding one of the main cooling channels.

19 Claims, 9 Drawing Sheets

(52) U.S. Cl.
    CPC ............... *H01L 2924/15311* (2013.01); *H05K 2201/064* (2013.01); *H05K 2201/10378* (2013.01)

(58) Field of Classification Search
    USPC ................. 361/700–719, 760–764, 795, 803
    See application file for complete search history.

(56) References Cited

U.S. PATENT DOCUMENTS

| | | | |
|---|---|---|---|
| 2011/0080713 A1* | 4/2011 | Sunohara | H01L 23/147 361/760 |
| 2013/0016477 A1* | 1/2013 | Yokoya | H01L 23/36 361/719 |

FOREIGN PATENT DOCUMENTS

| | | |
|---|---|---|
| JP | 2009-043978 | 2/2009 |
| JP | 2012-174963 | 9/2012 |

\* cited by examiner

INTERPOSER AND SEMICONDUCTOR DEVICE INCLUDING THE SAME

This application claims priority from Japanese Patent Application No. 2013-119125, filed on Jun. 5, 2013, the entire contents of which are herein incorporated by reference.

BACKGROUND OF THE INVENTION

1. Technical Field

The present disclosure relates to an interposer for cooling an electronic component, and a semiconductor device having the interposer.

2. Description of the Related Art

A semiconductor chip usually generates heat when it operates. The heat in the semiconductor chip is a factor causing the malfunction of the semiconductor chip and the degradation of the semiconductor chip. As a solution, the semiconductor chip is connected to a substrate including a cooling channel and a cooling medium is made to pass through the cooling channel of the substrate to thereby cool the semiconductor chip (for example, see JP-A-2008-159619).

Higher performance (higher operating speed) of the semiconductor chip increases the quantity of heat generation per unit area of the semiconductor chip. Therefore, excellent cooling efficiency of the semiconductor chip is required.

SUMMARY OF THE INVENTION

According to one or more illustrative aspects of the present invention, there is provided an interposer for cooling an electronic component. The interposer comprises: a substrate body comprising a first surface on which the electrode component is to be mounted and a second surface opposite to the first surface, the substrate body having a hollow cooling channel therein, wherein a cooling medium flows through the cooling channel, the cooling channel comprising: a plurality of main cooling channels extending in a certain direction and separated from each other; an inflow channel which is communicated with one end of the respective main cooling channels; and an outflow channel which is communicated with the other end of the respective main cooling channels, and a plurality of through electrode groups each comprising a plurality of through electrodes arranged in a line, wherein each of the though electrodes is formed through the substrate body to reach the first and second surfaces of the substrate body, and is to be electrically connected to the electrode component, and wherein the respective through electrode groups are partitioned by at least corresponding one of the main cooling channels.

According to one of aspects of the present invention, cooling efficiency of an electronic component can be made excellent.

DETAILED DESCRIPTION

Embodiments will be described below with reference to the accompanying drawings.

Incidentally, the accompanying drawings shown herein may be partially enlarged, or the dimensions, the ratios etc. indicated in the accompanying drawings may be different from those in a real case. In addition, hatching of some portion or portions may be omitted in order to easily understand the sectional structure of each member in sectional view.

Figure 1:
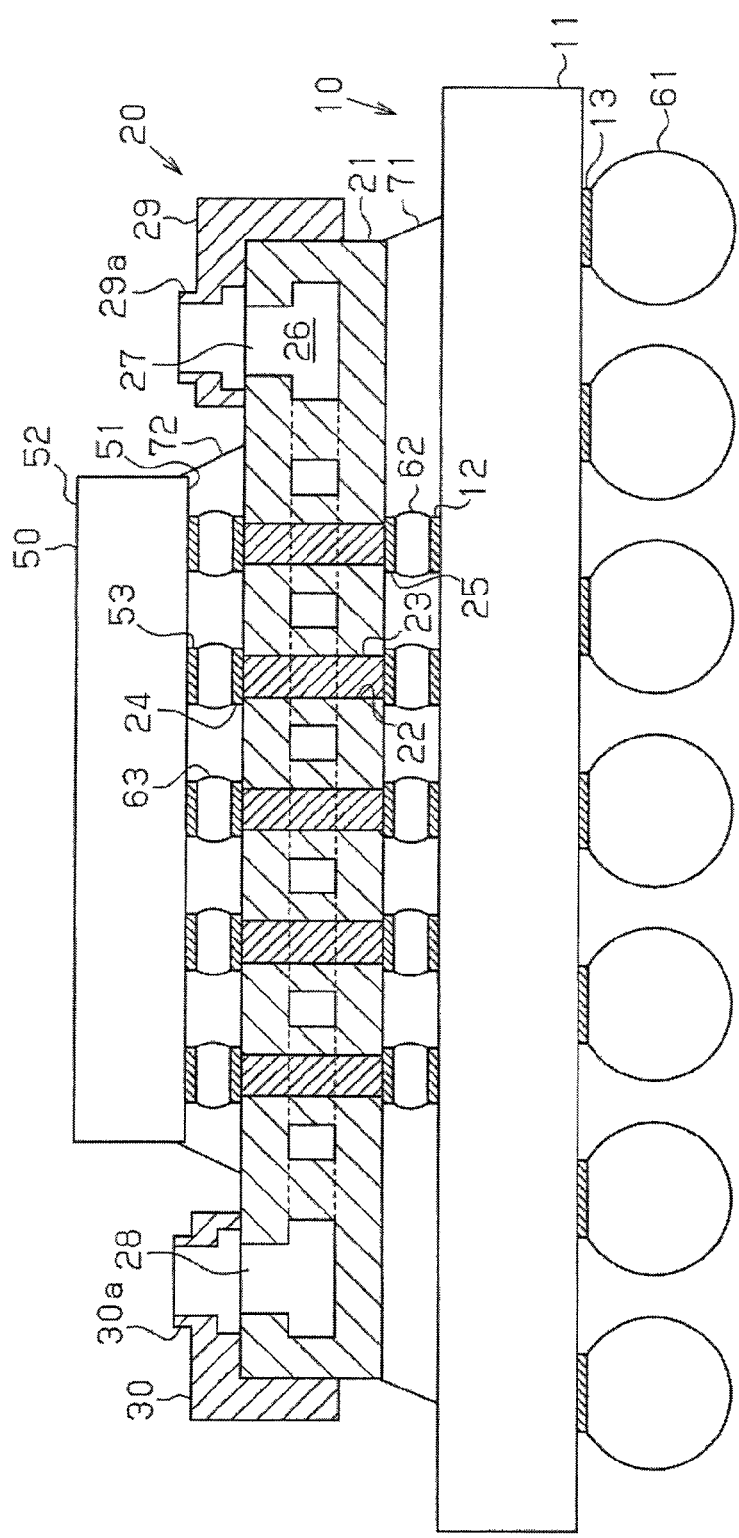
FIG. 1 is a schematic view for explaining a semiconductor device.

As shown in FIG. 1, a semiconductor device has a wiring board 10, an interposer 20, and a semiconductor chip 50. The semiconductor chip 50 is an example of an electronic component. The semiconductor chip 50 is mounted on the interposer 20 and the interposer 20 is mounted on the wiring board 10. That is, the semiconductor chip 50 is mounted on an upper surface of the interposer 20 and the interposer 20 is mounted on an upper surface of the wiring board 10. The wiring board 10 is mounted on a not-shown mount board (e.g. mother board).

The wiring board 10 has a board body 11. A plurality of electrode pads 12 are formed on the upper surface of the board body 11. The electrode pads 12 are connected to the interposer 20 through connection bumps 62. A plurality of electrode pads 13 are formed on a lower surface of the board body 11. Mount bumps 61 are formed on the electrode pads 13 respectively. The mount bumps 61 are electrically connected to electrode pads formed on the not-shown mount board. For example, the material of the electrode pads 12 or 13 is copper (Cu), nickel (Ni), a nickel alloy, etc. For example, the mount bumps 61 are solder bumps or solder bumps containing metal cores (e.g. copper cores).

For example, the board body 11 is a substrate made of an organic base material (an organic substrate). Preferably, the organic substrate contains fibers such as glass fibers. The board body 11 has a conductive member (not shown) which electrically connects the electrode pads 12 in the upper surface and the electrode pads 13 in the lower surface to one another. For example, the conductive member contains one wiring layer or via or a plurality of wiring layers or vias formed inside the board body 11. For example, the board body 11 is a core-including build-up substrate having a core substrate, a coreless substrate not having any core substrate, etc.

The interposer 20 has a substrate body 21. For example, the substrate body 21 is formed into a rectangular shape in planar view. For example, the material of the substrate body 21 is silicon (Si).

Through holes 22 penetrating between a first surface (upper surface) and a second surface (lower surface) are formed in the substrate body 21. Through electrodes 23 are formed in the through holes 22. For example, the material of the through electrodes 23 is copper.

A plurality of electrode pads 24 are formed on the upper surface of the substrate body 21. The electrode pads 24 are connected to the semiconductor chip 50 through connection bumps 63. A plurality of electrode pads 25 are formed on the lower surface of the substrate body 21. The electrode pads 25 are one example of terminals. For example, the material of the electrode pads 24 or 25 is copper (Cu), nickel (Ni), a nickel alloy, etc. The electrode pads 24 and the electrode pads 25 are electrically connected to each other through the through electrodes 23. The electrode pads 25 are electrically connected to the electrode pads 12 of the wiring board 10 through the bumps 62.

A space between the interposer 20 and the wiring board 10 is filled with an underfill resin 71. The underfill resin 71 has a fillet which is gently slanted and broadened from a lower portion of a side surface of the interposer 20 toward the upper surface of the wiring board 10. Examples of the material of the underfill resin 71 includes insulating resins such as an epoxy-based resin and a polyimide-based resin, and resin materials obtained by mixing a filler of silica, alumina, etc. with the resins. The underfill resin 71 improves connection strength between the wiring board 10 and the interposer 20. In addition, the underfill resin 71 suppresses corrosion of the electrode pads 12 and 25 formed on the wiring board 10 and the interposer 20, occurrence of electromigration, the lowering of the reliability of wires (wire disconnection caused by stress applied to the electrode pads 12 and 25), etc.

The semiconductor chip 50 has a device surface 51 in which, for example, elements and wires (not shown) of a logic circuit etc. are formed, and a back surface 52 which is located on an opposite side to the device surface 51.

Electrode pads 53 are formed on the device surface 51 of the semiconductor chip 50. For example, the material of the electrode pads 53 is copper. The electrode pads 53 are electrically connected to the electrode pads 24 of the interposer 20 through the bumps 63. For example, the bumps 63 are solder bumps. Accordingly, the semiconductor chip 50 is flip-chip bonded to the interposer 20.

A space between the semiconductor chip 50 and the interposer 20 is filled with an underfill resin 72. The underfill resin 72 has a fillet which is gently slanted and broadened from a lower portion of a side surface (an end portion on the device surface 51 side) of the semiconductor chip 50 toward the upper surface of the interposer 20. Examples of the material of the underfill resin 72 include insulating resins such as an epoxy-based resin and a polyimide-based resin, and resin materials obtained by mixing a filler of silica, alumina, aluminum nitride, etc. with these resins. The underfill resin 72 improves connection strength between the semiconductor chip 50 and the interposer 20 and reduces failure in the wires etc., similarly to the underfill resin 71 between the wiring board 10 and the interposer 20.

The filler of alumina etc. contained in the underfill resin 72 has higher thermal conductivity than that of the main component of the underfill resin 72. Such a filler increases the thermal conductivity of the underfill resin 72 so that the heat generated in the device surface 51 of the semiconductor chip 50 can be conducted to the interposer 20. Incidentally, a metal material covered with an insulating material (such as a resin material) can be used as the filler. For example, gold (Au), silver (Ag), copper (Cu), aluminum (Al), nickel (Ni), chrome (Cr) or cobalt (Co) can be used as the metal material.

A cooling channel 26 is formed inside the interposer 20. The cooling channel 26 is filled with a cooling medium for cooling the semiconductor chip 50. For example, the cooling medium is a liquid or gas of water, alcohol, fluorine, etc. An inlet 27 for pouring the cooling medium into the cooling channel 26 and an outlet 28 for draining the cooling medium from the cooling channel 26 are formed in the upper surface of the interposer 20.

Connectors 29 and 30 for connecting pipe arrangement for circulating the cooling medium are connected to the interposer 20. The connectors 29 and 30 are one example of connection members. The connectors 29 and 30 are formed so as to be connected to the upper and side surfaces of the interposer 20. Annular connection portions 29a and 30a protruding upward are formed in upper surfaces of the connectors 29 and 30. The not-shown pipe arrangement is connected to these connection portions 29a and 30a. The pipe arrangement is connected to a pump for circulating the cooling medium and a heat exchanger for radiating the heat of the cooling medium, for example, to the atmosphere.

Figure 2A:
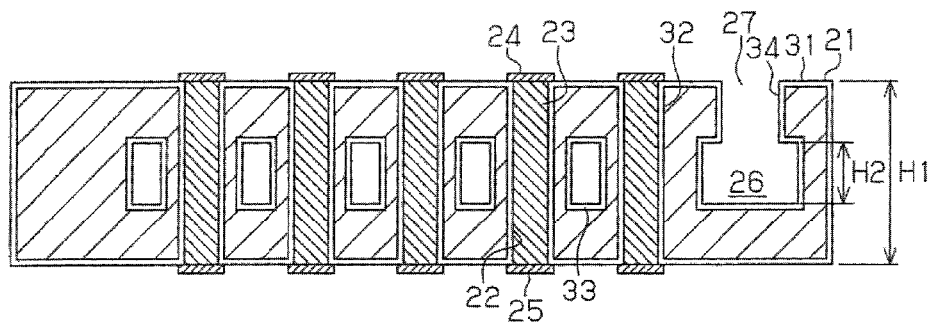
FIGS. 2A and 2B are a vertical sectional view and a horizontal sectional view of an interposer according to an embodiment of the present invention.

As shown in FIG. 2A, an insulating film 31 is formed on the surfaces (the upper surface, the lower surface and the side surface) of the substrate body 21 of the interposer 20. Through holes 22 are formed in the substrate body 21. An insulating film 32 is formed on inner circumferential surfaces of the through holes 22. Through electrodes 23 formed in the through holes 22 are insulated from the substrate body 21 by the insulating film 32. In addition, the cooling channel 26 is formed inside the substrate body 21 and an insulating film 33 is formed on a wall surface of the cooling channel 26. Similarly, an insulating film 34 is formed on an inner circumferential surface of the inlet 27. For example, the substrate body 21 is a silicon substrate, and the insulating films 31 to 34 are silicon oxide films (SiO). For example, the thickness (H1) of the interposer 20 is in the range of from 150 μm (micrometer: micron) to 1.5 mm (millimeter). For example, the height H2 of the cooling channel 26 is in the range of from 50 μm to 1 mm.

Figure 2B:
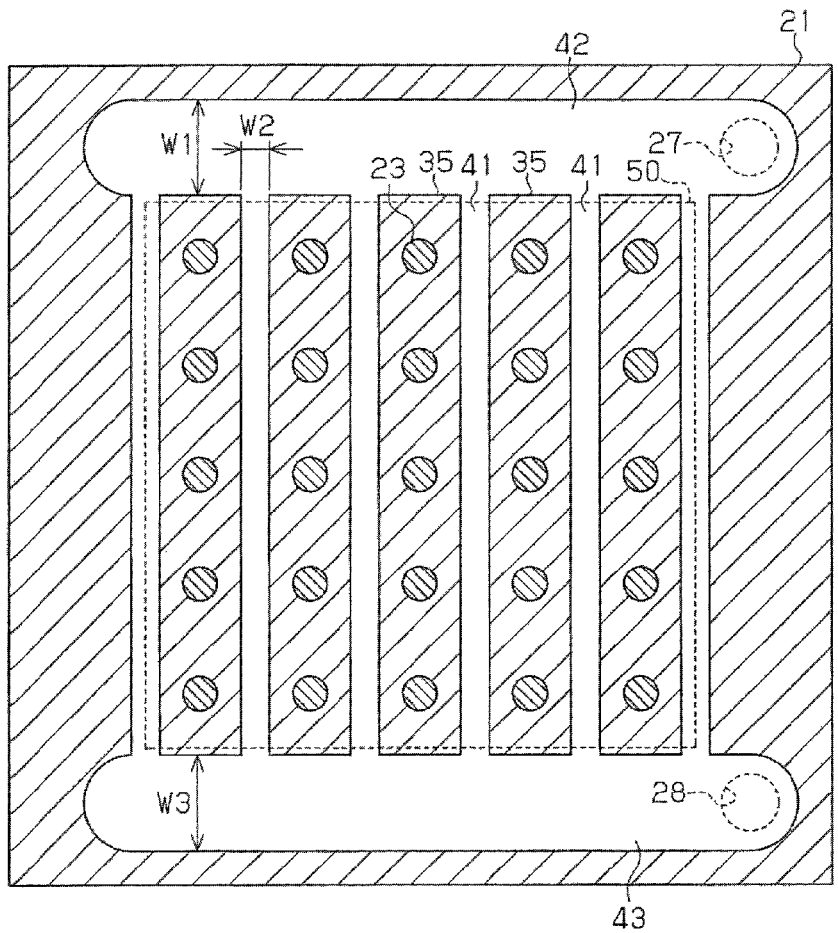

As shown in FIG. 2B, the interposer 20 is formed into a square shape 40 mm (millimeter) long each side. For example, the diameter of each of the through electrodes 23 is in the range of from 20 μm to 60 μm. For example, the array pitch of the through electrodes 23 is 150 μm. For example, the film thickness of each of the insulating films 31 to 34 is in the range of from 1 μm to 2 μm. Incidentally, the insulating films 31 to 34 are omitted in FIG. 2B.

The cooling channel 26, the inlet 27 through which the cooling medium flows into the cooling channel 26, and the outlet 28 through which the cooling medium flows out from the cooling channel 26 are formed in the interposer 20. For example, the inlet 27 and the outlet 28 are formed in opposite end portions of one side (an upper end portion and a lower end portion of a right side in FIG. 2B) of the interposer 20 which is formed into a rectangular shape.

The cooling channel 26 has a plurality of main cooling channels 41, an inflow channel 42 for pouring the cooling medium into the main cooling channels 41, and an outflow channel 43 for draining the cooling medium from the main cooling channels 41.

In the interposer 20, a plurality of inner walls 35 are formed in regions corresponding to the semiconductor chip 50 designated by the broken line. Each of the plurality of inner walls 35 is substantially formed into a rectangular shape extending in a predetermined direction (an up/down direction in FIG. 2A). The through electrodes 23 are formed to penetrate the respective inner walls 35. The plurality of inner walls 35 partition the regions (internal spaces) corresponding to the semiconductor chip 50 mounted on the interposer 20 so that each of the main cooling channels 41 is formed between adjacent ones of the inner walls 35. Accordingly, the cooling medium supplied into the main cooling channels 41 flows along the inner walls 35.

First end portions (for example, upper ends in FIG. 2B) of the plurality of main cooling channels 41 are connected to one another by the inflow channel 42. Accordingly, the inflow channel 42 is formed to extend in a direction (a left/right direction in FIG. 2B) perpendicular to the main cooling channels 41. The width W1 of the inflow channel 42 is set to be wider than the width W2 of the main cooling channel 41. For example, the width W1 of the inflow channel 42 is 1 mm and the width W2 of the main cooing channel 41 is 60 µm. The inlet 27 is formed in an end portion (the right end in FIG. 2B) of the inflow channel 42. The cooling medium is supplied from the inlet 27 into the inflow channel 42. Accordingly, the cooling medium is supplied from the inflow channel 42 into the plurality of main cooling channels 41.

In addition, second end portions (lower ends in FIG. 2B) of the plurality of main cooling channels 41 are connected to one another by the outflow channel 43. Accordingly, the outflow channel 43 is formed to extend in the direction (the left/right direction in FIG. 2B) perpendicular to the main cooling channels 41. The width W3 of the outflow channel 43 is set to be wider than the width W2 of the main cooling channel 41. For example, the width W3 of the outflow channel 43 is set to be equal to the width W1 (1 mm) of the inflow channel 42. The outlet 28 is formed in an end portion (the right end in FIG. 2B) of the outflow channel 43. The outflow channel 43 communicates with the outlet 28. The cooling medium flowing into the plurality of main cooling channels 41 are drained from the outlet 28 through the outflow channel 43.

Next, effects of the interposer 20 will be described.

As shown in FIG. 1, the semiconductor chip 50 is connected to the through electrodes 23 of the interposer 20 through the electrode pads 53 formed on the device surface 51. The cooling channel 26 is formed inside the interposer 20. A cooling medium is supplied into the cooling channel 26. Heat exchange is performed between the inner walls 35 of the interposer 20 and the cooling medium.

The semiconductor chip 50 generates heats mainly on the device surface 51 side in which elements (transistors, resistors, etc.) contained in the logic circuit are formed. The electrode pads 53 formed on the device surface 51 and the bumps 63 conduct heat generated in the device surface 51 of the semiconductor chip 50 to the through electrodes 23 of the interposer 20. The through electrodes 23 penetrate the inner walls 35 of the interposer 20. Accordingly, the heat of the through electrodes 23 is conducted to the inner walls 35. The inner walls 35 are cooled by the heat exchange with the cooling medium. Accordingly, the semiconductor chip 50 is cooled by the interposer 20 connected to the electrode pads 53 on the device surface 51.

As shown in FIG. 2B, the cooling channel 26 has the plurality of main cooling channels 41 partitioned by the inner walls 35. The one ends of the plurality of main cooling channels 41 are connected to the inflow channel 42. The width W1 of the inflow channel 42 is wider than the width W2 of the main cooling channel 41. Accordingly, the cooling medium is supplied into the plurality of main cooling channels 41 from the inflow channel 42. The cooling medium passing through the plurality of main cooling channels 41 is drained into the outflow channel 43 from the main cooling channels 41. The width W3 of the outflow channel 43 is wider than the width W2 of the main cooling channel 41. Accordingly, the cooling medium passing through each of the main cooling channels 41 is drained to the outflow channel 43. The cooling medium is cooled by a cooler and circulated by a pump. In this manner, the cooling medium can be efficiently circulated in the plurality of main cooling channels 41. Thus, the semiconductor chip 50 can be cooled.

Manufacturing steps of the interposer 20 will be described below.

Figure 3A:
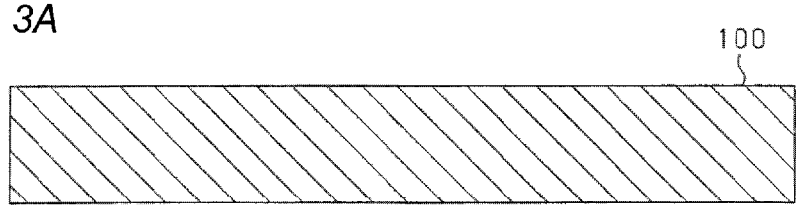
FIGS. 3A to 3E are schematic sectional views showing manufacturing steps for the interposer.

First, as shown in FIG. 3A, a substrate 100 with a predetermined thickness is prepared. For example, this substrate 100 is a silicon wafer.

Figure 3B:
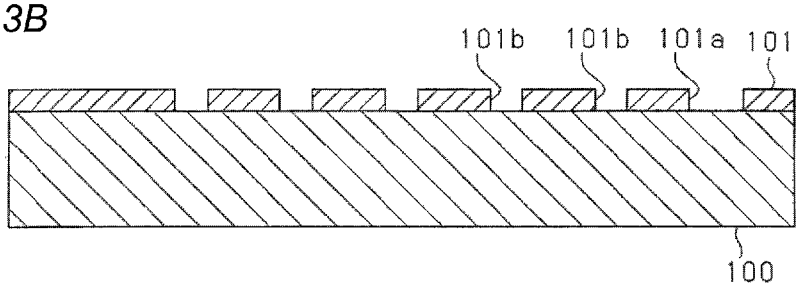

Next, as shown in FIG. 3B, a resist film 101 is formed on an upper surface of the substrate 100 to cover the whole of the upper surface. For example, the resist film 101 is obtained by applying a liquid resist material into a uniform thickness or pasting a sheet-like resist material. An opening portion 101a corresponding to the inlet 27 shown in FIG. 1 and opening portions 101b corresponding to the through holes 22 are formed in the resist film 101, for example, by photolithography. Incidentally, although the opening portion 101a corresponding to the inlet 27 (see FIG. 1) is shown in FIG. 3B, an opening portion corresponding to the outlet 28 shown in FIG. 1 is also formed in the resist film 101.

Figure 3C:
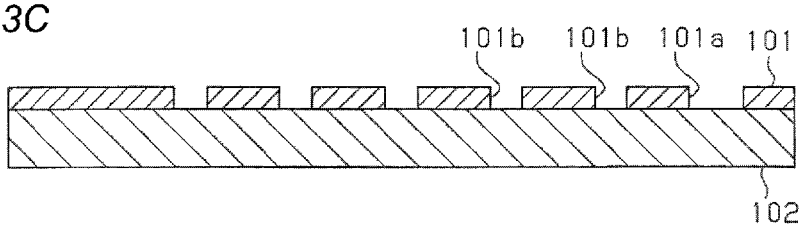

Next, a thinned substrate 102 is obtained, as shown in FIG. 3C. This substrate 102 is obtained by thinning the substrate 100 shown in FIG. 3B, for example, by polishing or etching from an opposite surface to the surface where the resist film 101 is formed. For example, the polishing is chemical mechanical polishing (CMP). The etching is wet etching using a solution containing nitric acid ($HNO_3$) or hydrogen fluoride (HF) as an etchant, plasma etching (dry etching), etc.

Figure 3D:
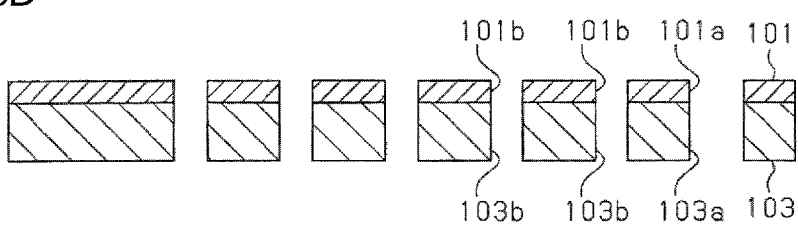

Next, as shown in FIG. 3D, a substrate 103 having through holes 103a and 103b is formed, for example, by anisotropic etching using the resist film 101 as a mask. The through hole 103a corresponds to the inlet 27 (outlet 28) shown in FIG. 1. The through holes 103b correspond to the through holes 22. For example, the anisotropic etching is deep reactive ion etching (DRIE).

Figure 3E:
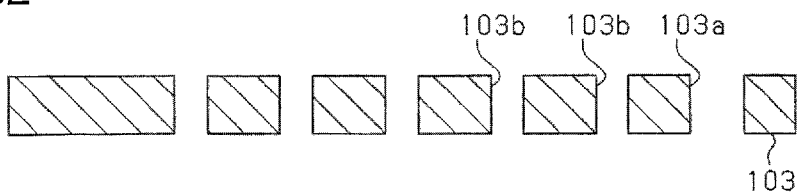

As shown in FIG. 3E, the resist film 101 is removed.

Figure 4A:
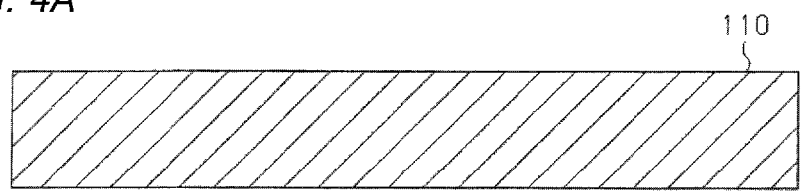
FIGS. 4A to 4D are schematic sectional views showing manufacturing steps for the interposer.

Next, as shown in FIG. 4A, a substrate 110 with a predetermined thickness is prepared. For example, this substrate 110 is a silicon wafer.

Figure 4B:
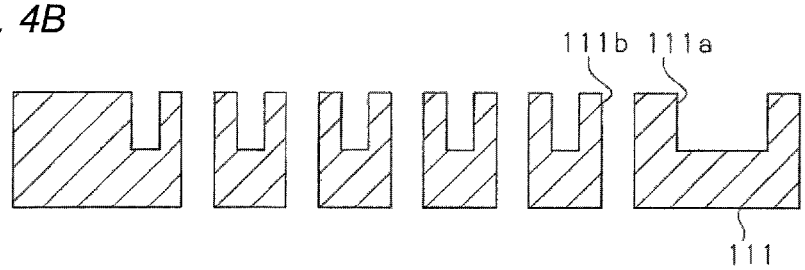

Next, steps until a substrate 111 shown in FIG. 4B is obtained will be described. First, a resist film is formed to cover the whole of an upper surface of the substrate 110 shown in FIG. 4A. For example, the resist film is a photosensitive resist film. A sheet-like resist film (dry film) or a liquid resist agent may be used. Opening portions corresponding to the through holes 22 shown in FIG. 1 are formed in the resist film, for example, by photolithography. Through holes 111b are formed in the substrate 110, for example, by anisotropic etching from the opening portions. Then, the resist film is removed, for example, by ashing. Next, a resist film is formed to cover the whole of the upper surface of the substrate. For example, the resist film is a photosensitive sheet-like resist film (dry film). An opening portion corresponding to the cooling channel 26 shown in FIG. 1 is formed in the resist film, for example, by photolithography. A groove 111a is formed in the substrate, for example, by anisotropic etching from the opening portion. The resist film is removed, for example, by ashing.

Figure 4C:
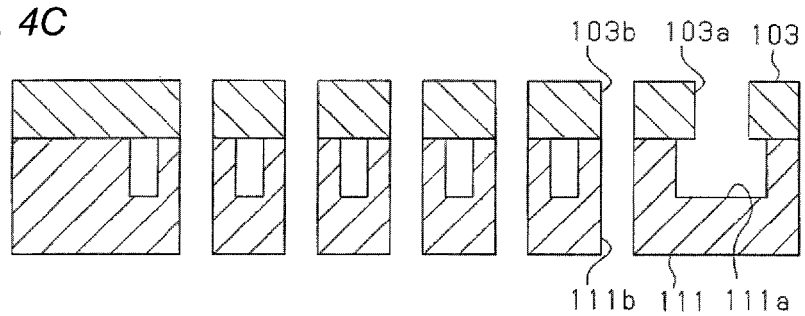
Figure 4D:
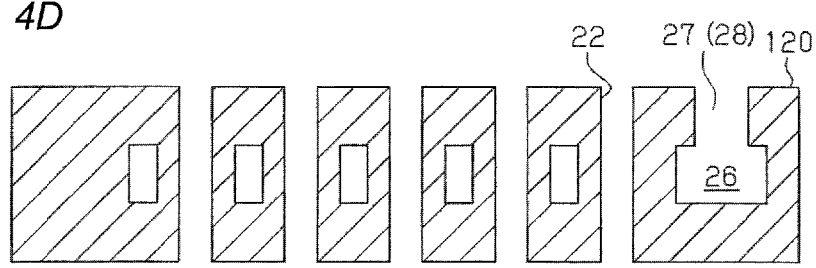

Next, the substrate 103 and the substrate 111 are aligned and put on top of each other, as shown in FIG. 4C. The substrate 103 and the substrate 111 are bonded to each other. In this manner, a substrate 120 shown in FIG. 4D is obtained. The substrate 120 has the through holes 22, the cooling channel 26 and the inlet 27 (and the outlet 28). These substrates may be bonded to each other, for example, by plasma treatment or pressure treatment. The plasma treatment is a treatment in which a bonding surface of the substrate 103 and a bonding surface of the substrate 111 are exposed to plasma (for example, plasma using argon (Ar) gas) to remove oxide films, contaminants, etc. on the bonding surfaces and the bonding surfaces from which the oxide films etc. have been completely removed are made into contact with each other and bonded to each other by pressure. The pressure treatment is a treatment in which pressure and heat low enough not to cause conspicuous plastic deformation are applied to the substrate 103 and the substrate 111 so as to bond the substrate 103 and the substrate 111 to each other.

Figure 5A:
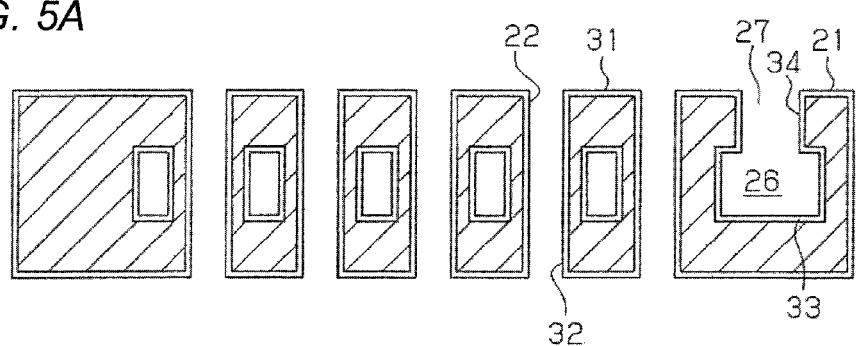
FIGS. 5A to 5D are schematic sectional views showing manufacturing steps for the interposer.

Next, as shown in FIG. 5A, insulating films 31 to 34 are formed so that a substrate body 21 is obtained. The insulating films 31 to 34 are silicon oxide films (thermal oxide films) obtained by applying heat treatment (for example, heating to 1,100° C. in a treatment chamber) to the substrate 120 shown in FIG. 4D. Instead of silicon oxide film, the insulating films 31 to 34 may be silicon nitride film. Of course, the material of the insulating films 31 to 34 is not particularly restricted as far as the insulating films 31 to 34 have insulating property.

Figure 5B:
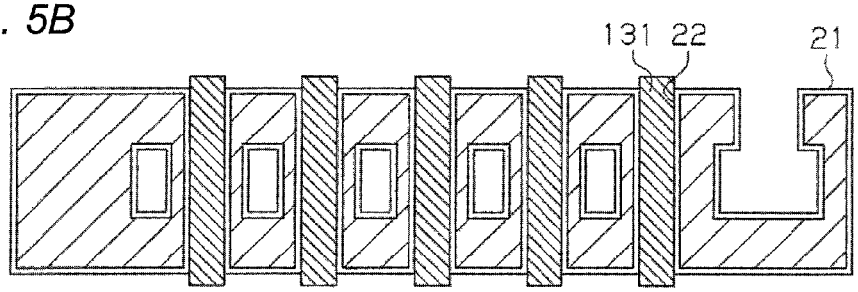

Next, a conductive layer 131 is formed in the through holes 22, as shown in FIG. 5B. For example, the conductive layer 131 is copper. The conductive layer 131 is formed by plating inner surfaces of the through holes 22. For example, the surface of the substrate body 21 is covered with a resist film and opening portions corresponding to the through holes 22 are formed in the resist film. For example, a seed layer is formed on inner surfaces of the through holes 22 by electroless plating and the conductive layer 131 is formed by electroplating of copper using the seed layer as an electrode.

Figure 5C:
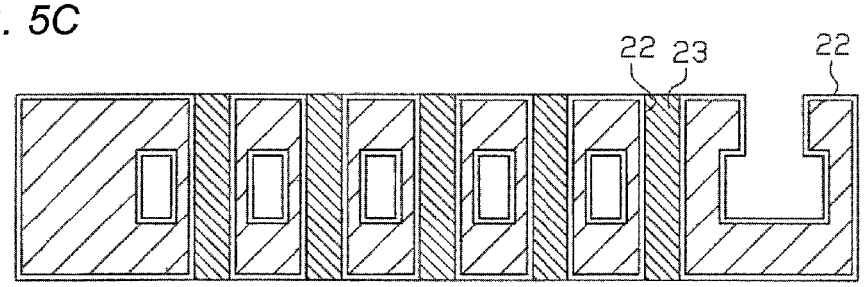

Next, the conductive layer 131 is flattened so that the through electrodes 23 are formed as shown in FIG. 5C. For example, the flattening method is chemical mechanical polishing (CMP). In this flattening treatment, end surfaces of the through electrodes 23 are made level with upper and lower surfaces of the substrate body 21.

Figure 5D:
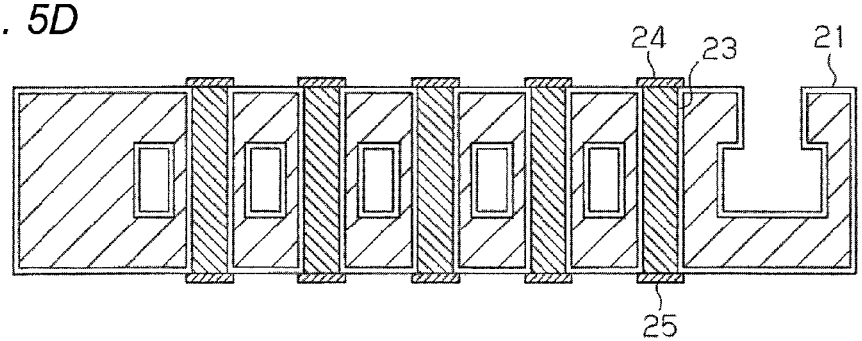

Next, electrode pads 24 and electrode pads 25 are formed on the end surfaces of the through electrodes 23, as shown in FIG. 5D.

For example, a seed layer is formed in a region corresponding to the through electrodes 23. The seed layer can be formed, for example, by sputtering or electroless plating. For example, titanium (Ti) and copper (Cu) are deposited successively by sputtering to form the seed layer. Incidentally, chrome (Cr) may be used for the seed layer.

Next, a resist film is formed on the seed layer and opening portions corresponding to the electrode pads 24 or 25 are formed in the resist film. For example, the resist film is a photosensitive resist film. A sheet-like resist film or a liquid resist agent may be used. Electroplating using the seed layer as an electrode is performed while the resist film is used as a plating mask. First, electroplating of copper (Cu), nickel (Ni), and gold (Au) is applied to the seed layer successively so that the electrode pads 24 or 25 are formed. The resist film and the seed layer which become unnecessary are removed.

As described above, according to the embodiment, the following effects can be obtained.

(1) The semiconductor chip 50 is connected to the through electrodes 23 of the interposer 20 through the electrode pads 53 formed on the device surface 51. The cooling channel 26 is formed inside the interposer 20. A cooling medium is supplied into the cooling channel 26. Heat exchange between the inner walls 35 of the interposer 20 and the cooling medium is performed. Accordingly, the semiconductor chip 50 can be cooled more efficiently than that in the case where, for example, the semiconductor chip 50 is cooled from the back surface of the semiconductor chip 50.

(2) The cooling channel 26 has the plurality of main cooling channels 41 partitioned by the inner walls 35. The one ends of the plurality of main cooling channels 41 are communicated with the inflow channel 42. The width W1 of the inflow channel 42 is wider than the width W2 of the main cooling channel 41. Accordingly, the cooling medium flows into each of the plurality of main cooling channels 41 from the inflow channel 42. The cooling medium passing through the plurality of main cooling channels 41 flows out to the outflow channel 43 from the main cooling channels 41. The width W3 of the outflow channel 43 is wider than the width W2 of the main cooling channel 41. Accordingly, the cooling medium passing through each of the main cooling channels 41 is drained to the outflow channel 43. The cooling medium is cooled by a cooler and circulated by a pump. In this manner, the cooling medium can be circulated in the plurality of main cooling channels 41 efficiently. Accordingly, the semiconductor chip 50 can be cooled efficiently.

Incidentally, each of the embodiments may be carried out in the follow modes.

The shape of the cooling channel may be changed suitably.

For example, the width of the inflow channel 42 may be set in accordance with its distance from the inlet 27. For example, the set width of the inflow channel 42 is a distance between an end surface of each of the inner walls 35 and a side surface opposite to the end surface. In addition, the width of the outflow channel 43 may be set in accordance with its distance from the outlet 28. For example, the set width of the outflow channel 43 is a distance between an end surface of each of the inner walls 35 and a side surface opposite to the end surface.

Figure 6:
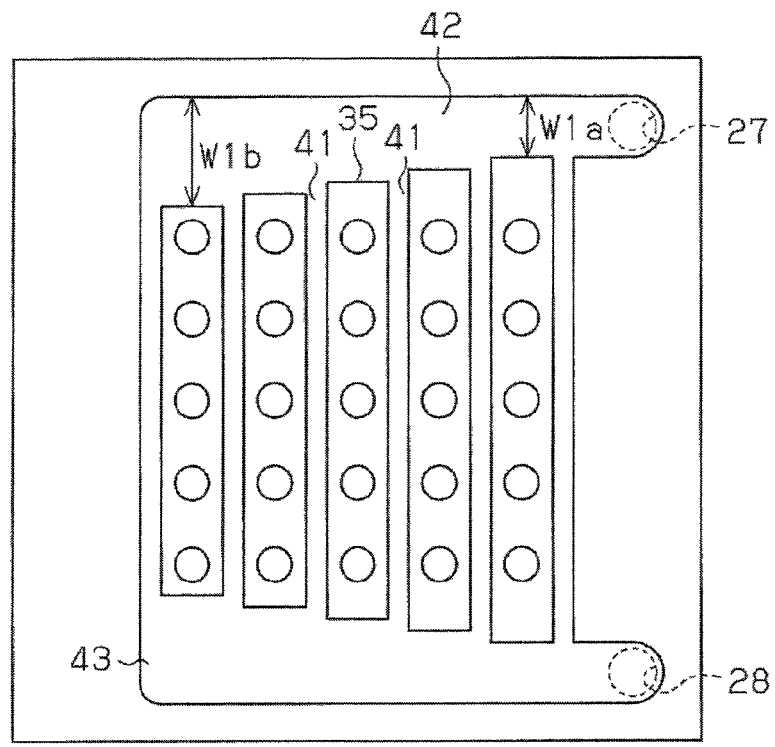
FIG. 6 is an explanatory view of another interposer.

For example, the width of the inflow channel 42 may be set to be wider as it goes farther from the inlet 27, for example, as shown in FIG. 6. For example, a width W1a in a place near to the inlet 27 and a width W1b in a place far from the inlet 27 may be set so that a difference between the width W1a and the width W1b is in the range of from 100 µm to 1 mm. Similarly, the width of the outflow channel 43 may be set to be wider as it goes farther from the outlet 28. Incidentally, although the width of the inflow channel 42 and the width of the outflow channel 43 are variable in FIG. 6, the width of either of the inflow channel 42 and the outflow channel 43 may be variable alternatively.

Figure 7:
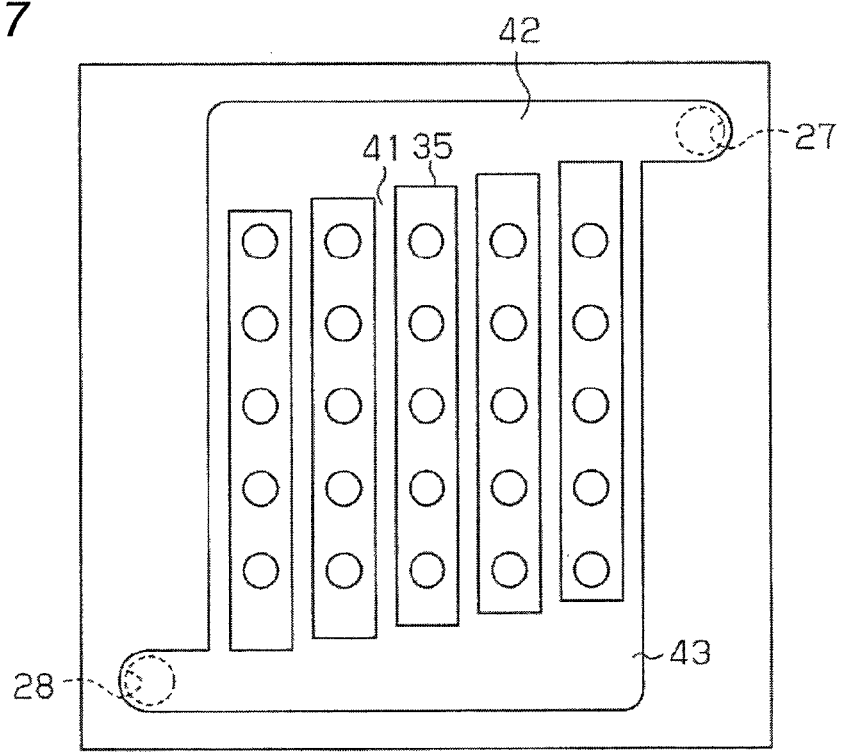
FIG. 7 is an explanatory view of another interposer.

In addition, as shown in FIG. 7, the inlet 27 and the outlet 28 may be formed in the vicinities of diagonally opposite angles of the interposer 20. Incidentally, in FIG. 7, the width of the inflow channel 42 may be set constant. In addition, the width of the outflow channel 43 may be set constant.

Figure 8:
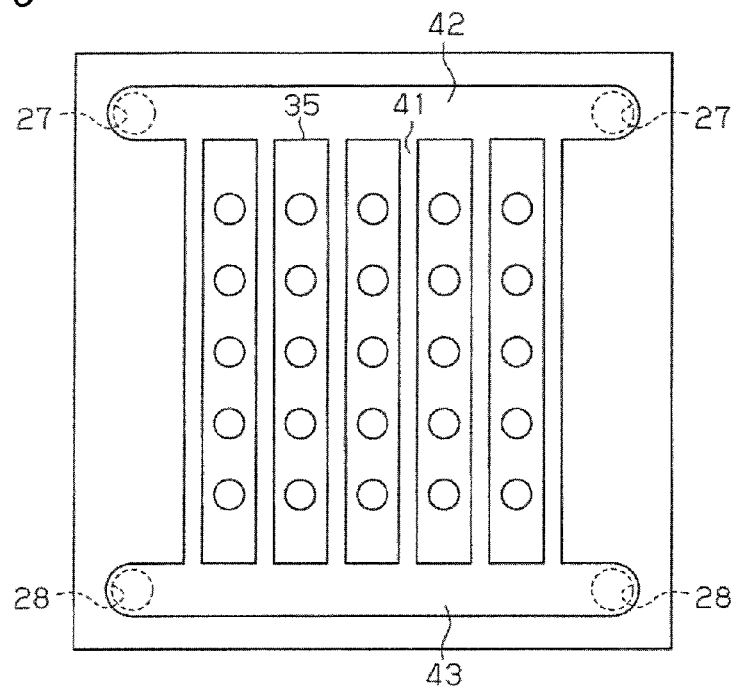
FIG. 8 is an explanatory view of another interposer.

In addition, as shown in FIG. 8, two inlets 27 may be formed for the inflow channel 42. In addition, three or more inlets 27 may be formed alternatively. In addition, two outlets 28 may be formed for the outflow channel 43. In addition, three or more outlets 28 may be formed alternatively.

Figure 9:
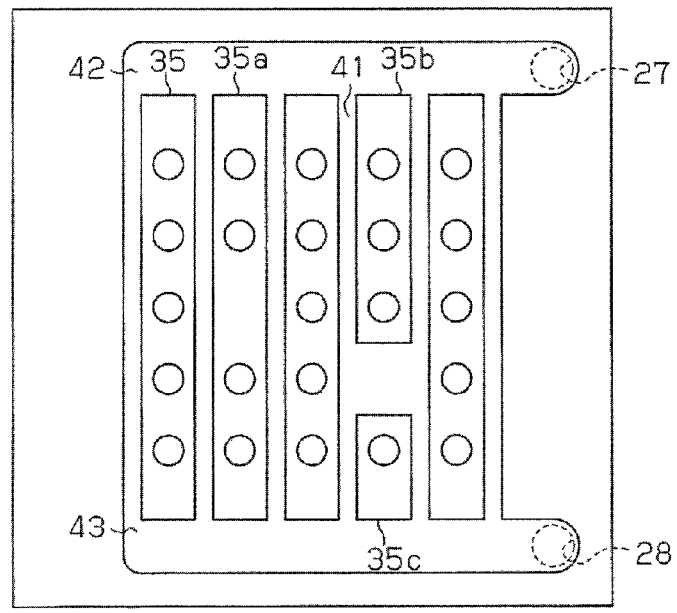
FIG. 9 is an explanatory view of another interposer.

In addition, as shown in FIG. 9, some through electrodes 23 may be omitted in accordance with the terminals of the semiconductor chip mounted on the interposer 20. For example, as shown in FIG. 9, five through electrodes 23 may be formed in each inner wall 35 and four through electrodes 23 may be formed in each inner wall 35a. Incidentally, split inner walls 35b and 35c may be formed in accordance with the positions where the through electrodes 23 are formed. In this case, the area where the inner wall 35 is in contact with the cooling medium is larger than that in the case where the inner wall 35 is not split. Thus, heat exchange can be performed more efficiently.

Although the inlet 27 is formed in an end portion of the inflow channel 42 in the embodiment, the inlet 27 may be formed in the middle of the inflow channel 42 or may be substantially formed, for example, in the longitudinal center of the inflow channel 42. Similarly, the outlet 28 may be formed in the middle of the outflow channel 43 or may be substantially formed, for example, in the longitudinal center of the outflow channel 43.

Figure 10:
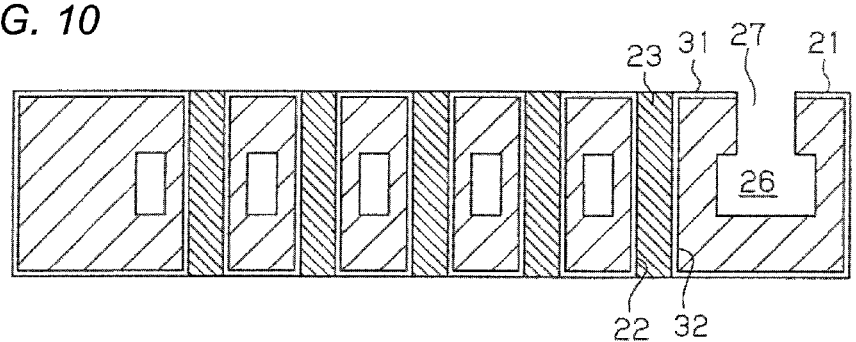
FIG. 10 is a vertical sectional view of another interposer.

Configuration may be made so that the insulating films 33 and 34 shown in FIG. 2A are not formed internally in the substrate body 21, as shown in FIG. 10. That is, silicon which is the material of the substrate body 21 is exposed in the cooling channel 26. Such a substrate body can be obtained in such a manner that, for example, two silicon substrates are bonded to each other to form a substrate having the cooling channel 26 and the through holes 22, and the inlet 27 and the outlet 28 are formed in the thus formed substrate after heat treatment is applied to the substrate. Since silicon has water-repellent property, resistance of silicon to the cooling medium passing through the cooling channel 26 is smaller than resistance of a silicon oxide film to the cooling medium. Accordingly, the cooling medium can flow easily.

In the embodiment, the substrate 103 (see FIG. 3E) in which the through hole 103a corresponding to the inlet 27 (outlet 28) is formed, and the substrate 111 (see FIG. 4B) in which the groove 111a corresponding to the cooling channel 26 is formed are bonded to each other to thereby form the substrate body 21. The shapes of the two substrates bonded to each other may be changed suitably.

Figure 11:
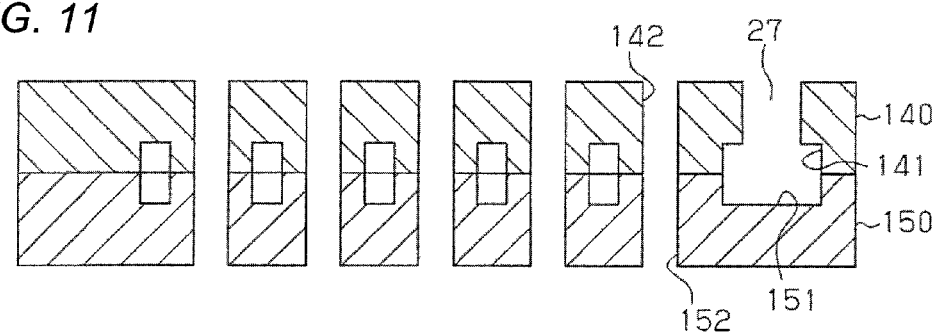
FIG. 11 is a schematic vertical sectional view of another interposer.

For example, configuration may be made so that a substrate 140 in which a groove 141 corresponding to the inlet 27 (outlet 28) and the cooling channel 26 is formed and a substrate 150 in which a groove 151 corresponding to the cooling channel 26 is formed are bonded to each other to thereby form a board body as shown in FIG. 11. Incidentally, in FIG. 11, the through holes 22 are formed when the substrates 140 and 150 having through holes 142 and 152 corresponding to the through holes 22 (see the drawings) are boned to each other. However, the through holes 22 may be formed after the substrates 140 and 150 are bonded to each other.

Figure 12:
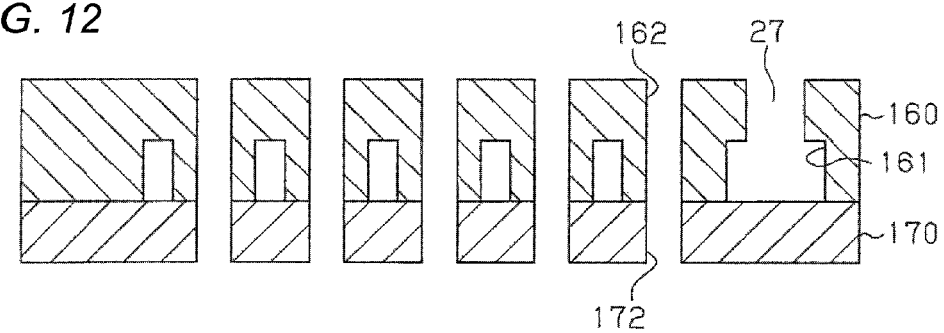
FIG. 12 is a schematic vertical sectional view of another interposer.

In addition, configuration may be made so that a substrate 160 in which a groove 161 corresponding to the inlet 27 (outlet 28) and the cooling channel 26 is formed and a flat plate-like (i.e. grooveless) substrate 170 are bonded to each other to form a substrate body, as shown in FIG. 12. Incidentally, in FIG. 12, the through holes 22 are formed when the substrates 160 and 170 having through holes 162 and 172 corresponding to the through holes 22 (see the drawings) are bonded to each other. However, the through holes 22 may be formed after the substrates 160 and 170 are bonded to each other.

Configuration may be made in the embodiment so that the through holes 22 are formed after the two substrates are bonded to each other. For example, in FIG. 3B, the opening portions 101a corresponding to the inlet 27 and the outlet 28 shown in FIG. 1 are formed in the resist film 101 so that the substrate having the inlet 27 and the outlet 28 is formed. In FIG. 4B, the substrate 111 having the groove 111a corresponding to the cooling channel 26 is formed. The through holes are formed after these substrates are bonded to each other.

Configuration may be made so that a plurality of semiconductor chips are mounted on the interposer.

Figure 13:
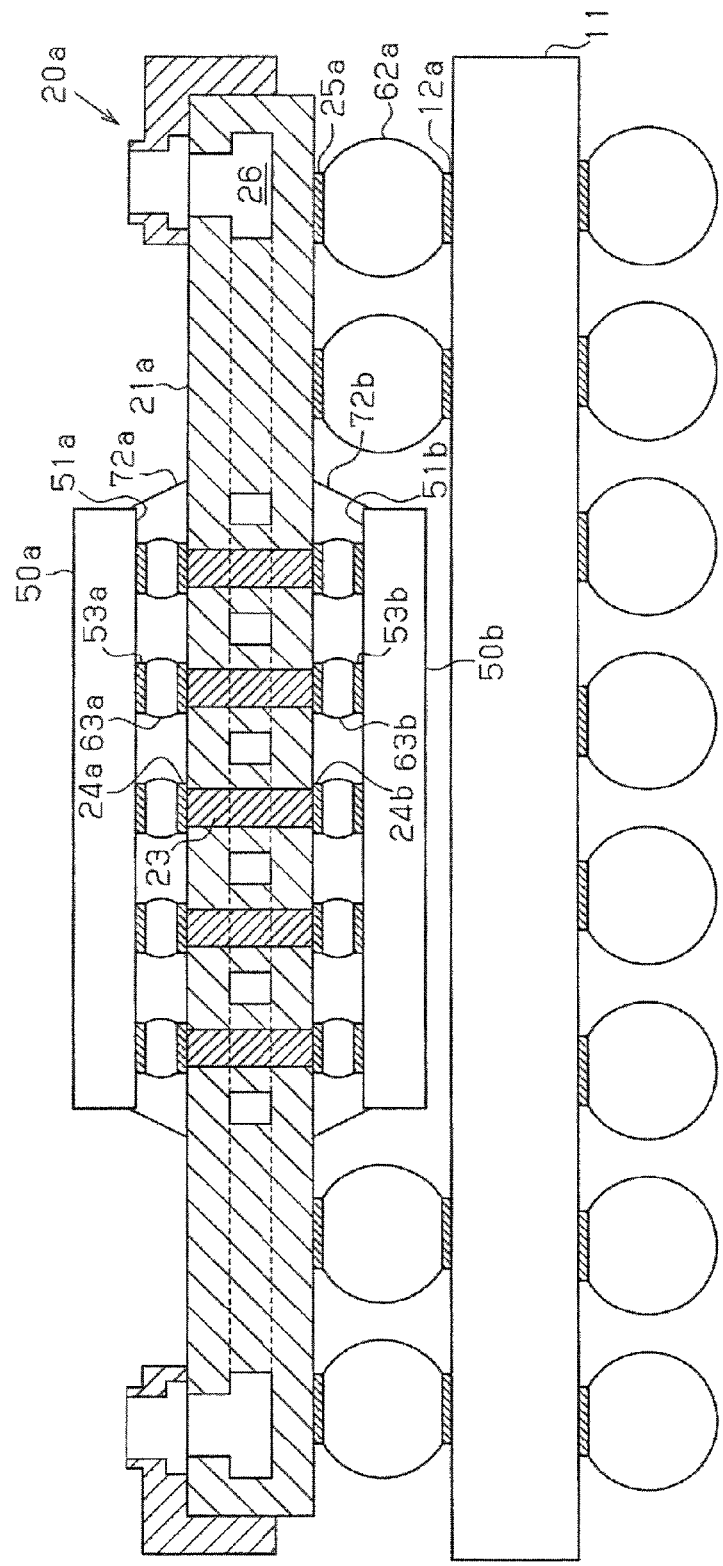
FIG. 13 is a schematic explanatory view of another semiconductor device.

For example, as shown in FIG. 13, a semiconductor chip 50a is mounted on an upper surface of an interposer 20a and a semiconductor chip 50b is mounted on a lower surface of the interposer 20a. Electrode pads 53a formed on a device surface 51a of the semiconductor chip 50a are connected to electrode pads 24a formed on the upper surface of a substrate body 21a through mount bumps 63a. A space between the semiconductor chip 50a and the interposer 20a is filled with an underfill resin 72a. Similarly, electrode pads 53b formed on a device surface 51b of the semiconductor chip 50b are connected to electrode pads 24b formed on the lower surface of the substrate body 21a through mount bumps 63b. A space between the semiconductor chip 50b and the interposer 20a is filled with an underfill resin 72b. A cooling channel 26 is formed in the interposer 20a. Accordingly, the two semiconductor chips 50a and 50b can be cooled efficiently by the interposer 20a.

In the interposer 20a, electrode pads 25a are formed on the lower surface of the substrate body 21a. The electrode pads 25a are connected to electrode pads 12a formed on an upper surface of a board body 11 through bumps 62a.

Incidentally, although one semiconductor chip 50a and one semiconductor chip 50b are mounted on the upper surface and the lower surface of the interposer 20a in FIG. 13, a plurality of semiconductor chips may be mounted on at least one of the upper surface and the lower surface of the interposer 20a. The electrode pads 25a are electrically connected to the electrode pads 24a and 24b through wiring patterns (not shown) and the through electrodes 23 which are formed in the interposer 20a.

For example, glass, ceramic, etc. may be used as the material of the substrate body 21 of the interposer 20 shown in FIG. 1.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. An interposer for cooling an electronic component, comprising:
   a substrate body comprising a first surface on which the electronic component is to be mounted and a second surface opposite to the first surface, the substrate body having a hollow cooling channel therein, wherein a cooling medium flows through the cooling channel, the cooling channel comprising:
      a plurality of main cooling channels extending in a certain direction and separated from each other;
      an inflow channel which is directly communicated with one end of each of the plurality of main cooling channels; and
      an outflow channel which is directly communicated with the other end of each of the plurality of main cooling channels, and
   a plurality of through electrode groups each comprising a plurality of through electrodes arranged in a line, wherein each of the though electrodes is formed through the substrate body to reach the first and second surfaces of the substrate body, and is to be electrically connected to the electronic component, and wherein the respective through electrode groups are partitioned by at least corresponding one of the main cooling channels.

2. The interposer of claim 1,
wherein the substrate body is provided with an inlet through which the cooling medium flows in the cooling channel, and
a cross-section area of the inflow channel in the certain direction is determined in accordance with a distance from the inlet.

3. The interposer of claim 1,
wherein the substrate body is provided with an outlet through which the cooling medium flows out the cooling channel, and
a cross-section area of the outflow channel in the certain direction is determined in accordance with a distance from the outlet.

4. The interposer of claim 1, wherein
an insulating film is formed on an inner wall surface of the substrate body, which defines each of the through holes in which the corresponding through electrode is formed, whereas no insulating film is formed on an inner wall surface of the substrate body which defines the cooling channel.

5. The interposer of claim 1, wherein
an insulating film is formed both on an inner wall surface of the substrate body, which defines each of the through holes in which the corresponding through electrode is formed, and on an inner wall surface of the substrate body which defines the cooling channel.

6. The interposer of claim 1, further comprising:
a connector connected to a pipe arrangement for circulating the cooling medium in the cooling channel.

7. A semiconductor device comprising:
the interposer of claim 1;
a wiring board on which the interposer is mounted; and
the electronic component which is mounted on the interposer.

8. The interposer of claim 1, wherein
first electrode pads are provided on the first surface of the substrate body and connected to the through electrodes, and
second electrode pads are provided on the second surface of the substrate body and connected to the through electrodes.

9. The interposer of claim 1, wherein the substrate body comprises the first surface on which the electronic component is to be mounted and the second surface on which another electronic component is to be mounted.

10. The interposer of claim 2,
wherein a width dimension of the inflow channel in the certain direction is determined in accordance with the distance from the inlet.

11. The interposer of claim 2, wherein the cross-section area of the inflow channel in the certain direction is increased as the distance from the inlet is increased.

12. The interposer of claim 3,
wherein a width dimension of the outflow channel in the certain direction is determined in accordance with the distance from the outlet.

13. The interposer of claim 3, wherein the cross-section area of the outflow channel in the certain direction is increased as the distance from the outlet is increased.

14. The interposer of claim 4, wherein the substrate body is a silicon substrate.

15. The interposer of claim 5, wherein the substrate body is a silicon substrate.

16. The semiconductor device of claim 7, further comprising:
an underfill resin provided between the interposer and the wiring board and containing a filler therein.

17. A semiconductor device comprising:
the interposer of claim 9;
a wiring board on which the interposer is mounted;
the electronic component which is mounted on the first surface of the substrate body of the interposer; and
the another electronic component which is mounted on the second surface of the substrate body of the interposer.

18. The interposer of claim 14, wherein the insulating film is a silicon oxide film.

19. The interposer of claim 15, wherein the insulating film is a silicon oxide film.

* * * * *